United States Patent [19]
Kydd et al.

[11] Patent Number: 6,153,348
[45] Date of Patent: Nov. 28, 2000

[54] ELECTROSTATIC PRINTING OF CONDUCTORS ON PHOTORESISTS AND LIQUID METALLIC TONERS THEREFOR

[75] Inventors: Paul H. Kydd, Lawrenceville; David L. Richard, Fanwood, both of N.J.

[73] Assignee: Parelec LLC, Rocky Hill, N.J.

[21] Appl. No.: 09/369,571

[22] Filed: Aug. 6, 1999

Related U.S. Application Data

[60] Provisional application No. 60/095,782, Aug. 7, 1998.

[51] Int. Cl.[7] .............................. G03G 9/12; C08K 3/08; B05D 5/12
[52] U.S. Cl. ......................... 430/119; 430/126; 106/118; 106/121
[58] Field of Search ..................................... 430/117, 118, 430/119, 126; 106/118, 121

[56] References Cited

U.S. PATENT DOCUMENTS 4,268,597  5/1981  Klavan et al. ........................ 430/117
4,892,798  1/1990  Lamanna et al. ...................... 430/119

*Primary Examiner*—John Goodrow
*Attorney, Agent, or Firm*—Woodridge & Associates, PC.; Stuart H. Nissin; Richard C. Woodbridge

[57] ABSTRACT

A metal particle liquid toner using PARMOD™ technology can be used to electrostatically print high resolution, electrically conductive metal images. The invention comprises a dispersion of metallic toner particles having metal particles combined with a metallo-organic compound, dispersed in an electrically insulating, organic liquid such as Exxon's Isopar with the addition of a charge director to give the proper charge on the toner particles and an appropriate conductivity to the dispersion. This dispersion can be used as a liquid toner to develop an electrostatically produced latent image. The developed image can then be heated to give a conductive image on the printing plate, or it can be transferred to a desirable low or high temperature substrate by an electrostatic gap transfer method and heated to give a conductive image.

18 Claims, No Drawings

ELECTROSTATIC PRINTING OF CONDUCTORS ON PHOTORESISTS AND LIQUID METALLIC TONERS THEREFOR

CROSS REFERENCE TO RELATED APPLICATIONS

This application is based upon and claims priority from U.S. Provisional Patent Application No. 60/095,782 filed Aug. 7, 1998 entitled "PARMOD™ Liquid Toner for Electrostatic Printing of Metallic Conductors."

TECHNICAL FIELD

This invention relates generally to a method of high resolution electrostatic transfer of a high density image to a receiving surface. More specifically, it pertains to the use of a liquid metallic toner which is electrostatically imaged on a photoresist-coated polymer laminate and cured in place to create an electric circuit which is well-bonded to the laminate.

BACKGROUND OF THE INVENTION

Electrostatic printing provides a method of producing high resolution images based on the electrostatic attraction of toner particles to an electrically charged image. Images can be created either electrophotograghically, as in a xeroxgraphic copier, or digitally as in a laser printer.

In the electrostatic printing process a plate having a permanent or persistent image or pattern of insulating material on a grounded conductive backing is charged, e.g., by corona discharge, to produce a latent image of electrostatic charge on the insulating areas, the image is developed by toning with oppositely charged particles, and the toner image is then transferred by electrostatic or other means to another surface such as paper or polymeric film. Since the original image is permanent or persistent, multiple copies can be made with a single exposure by repeating the charging, toning and transfer steps. A general description of the well known electrostatic printing process, including a number of examples of methods for preparing the electrostatic "master" is disclosed in U.S. Pat. No. 4,732,831 issued to Riesenfeld, et al.

The electrostatic printing process would be highly desirable for printing complex, high density, fine line resolution circuit traces. Exceptionally high resolution can be achieved with liquid toners which are a suspension of charged particles in a dielectric liquid medium. However, Conventional liquid toners use electrically insulating resin particles to form the image, and in many cases other polymeric organic binders for adhesion of the image. The images formed from these toners do not have highly conductive electrical properties. These liquid toners are generally used for the printing of high resolution black and white or color images. The printed images are organic in nature and therefore not electrically conductive.

U.S. Pat. No. 5,011,758 issued to Detig, et al., proposes using a modified electrostatic printing process in the manufacture of printed circuits. Detig et al., replaced a number of steps of the well known process of 1) photoimaging of a film resist on a circuit board substrate, 2) removal of unexposed film resist, 3) etching away the exposed conductive substrate, and 4) removing the remaining (developed) film resist to produce a circuit trace pattern. Detig et al., employ an electrostatic printing process using a "film resist" toner (liquid electrographic toner) to deposit the circuit pattern of resist on a conductive circuit board from a "master" pattern image, thus by-passing the photoexposure and resist development steps. The Detig et al., process still requires the use of highly corrosive and highly toxic chemicals for the etching and stripping steps.

The present invention overcomes the limitations of the known art and uses a modified electrostatic printing process with a new liquid metallic toner to print images on printed circuit boards and other electronic devices which can be cured to electrically conductive metal traces by heating. Unexpectedly, it has been found possible to electrostatically print a metallic toner on a photographically imaged photoresist and thermally cure it to a well-bonded, well-consolidated metallic conductor.

SUMMARY OF THE INVENTION

The process of this invention consists of the following steps:

1) An electrically conductive substrate is coated with a photoresist material, either in dry film or liquid form.
2.) The photoresist is imaged with a negative phototool of the electrical circuitry which is desired.
3.) The photoresist is cured to crosslink the exposed areas.
4.) The cross-linked image is charged by exposure to a corona discharge of the appropriate polarity for the liquid toner to be applied.
5.) The charged image is flooded with a liquid metallic toner suspension to create an image of the final device.
6.) The image is thermally cured to consolidate the toner material into a solid conductor or other component and to bond it to the conductive substrate by further cross-linking or thermoplastic flow of the photoresist.

The method of this invention can be applied advantageously to create patterns of metal conductors on dielectric polymer surfaces. With selectively formulated liquid metallic toners, other materials such as ferroelectric dielectrics, ferromagnetic suspensions and decorative or descriptive labels and the like can be applied in high resolution patterns by the photodefinition, electrostatic imaging and thermal curing process.

The resist-coated circuit board is based on a conventional printed wiring board laminate with a conductive surface, for example, copper foil attached to both sides of a glass-reinforced epoxy panel. The substrate is coated with a photosensitive resist material and exposed to light shining through a photographic negative of the desired final image. When the resist is cured, the image is crosslinked and rendered nonconductive electrically. A corona discharge will charge the image positively or negatively as desired, and the uncured area, which is more conductive than the cured photoresist, will dissipate the unwanted charge. A conductive ground plane, such as copper, under the resist is preferred to accomplish this dissipation.

The charged image is bathed with the liquid metallic toner suspension, and the charged toner particles are attracted to the oppositely charged image. In one embodiment the particles are then transferred to a separate dielectric substrate placed over the image and charged to attract the toner. The original image can be recharged and reused many times like a printing plate. In a second embodiment the original image on the resist-coated laminate is not transferred but is thermally cured to produce the finished product.

Liquid metallic toners of the present invention are based on PARMOD™ technology which make it possible to directly print electronic circuitry utilizing electrostatic printing technology. A representative liquid metallic toner consists of silver flake with an approximate particle size of five microns suspended in Exxon Isopar H to the extent of 0.5% by weight. Isopar is a saturated isoparaffin hydrocarbon often used as the dielectric liquid for liquid toners. A "charge director" of Troysol 98C, a fatty amine, was added to the extent of 5% by weight of the silver flake to charge the silver particles. The particles have a negative charge.

When a previously exposed and crosslinked resist-coated copper laminate was charged positively and bathed with the liquid metallic toner, a very high quality image was formed with good definition of fine features and good coverage of large solid areas. The image transfers well to a positively charged glass plate suspended above it. If the imaged liquid toner on the original laminate was thermally cured in place without transferring it to another substrate, the result was a well-bonded image on the resist which exhibited good electrical conductivity. The resist has the additional benefit of acting as an adhesive to bond the metal traces.

It has been discovered that PARMOD™ technology, based on coated metal particles, can be used to formulate liquid toners useful in electrostatic printing. These toners can be used to print high resolution images which can be converted to pure metal conductor traces of high electrical conductivity.

The basis of PARMOD™ technology is that mixtures of Metallo-Organic Decomposition (MOD) compounds and metal powders can be applied directly to conventional polymer-based substrates by any convenient printing technology and heated to decompose them to well-bonded, well-consolidated pure metal. A basic disclosure of PARMOD™ technology can be found in PCT Patent Application, Serial No. WO 98/37133 published Aug. 27, 1998. MOD compounds are those in which the metal is bound to the organic moiety via a heteroatom constituting a weak bond. While O, N, S, and P can serve as the heteroatom, preferred MOD compounds are metal soaps of carboxylic acids with oxygen as the heteroatom. The decomposition process occurs at temperatures of about 200–250° C. for silver. This is low enough to be compatible with polymer substrates, but can also be used with other conventional higher temperature substrates. PARMOD™ materials have been applied by screen printing, stenciling, gravure printing, and ink jet printing. This PARMOD™ technology has been utilized to create liquid metallic toners containing metal particles with a MOD compound which can be applied as circuit traces or other electronic components using electrostatic printing techniques.

Electrostatic printing involves the use of a liquid toner to develop a latent electrostatic image. A latent electrostatic image is created by applying an electrostatic charge, via a corona, to a photoimaged layer of resist on a grounded substrate. The liquid metallic toner is then applied to the substrate to develop the image through the electrostatic attraction of the charged toner particles to the oppositely charged image areas. The toned image can then be thermally cured directly on the photoimaged substrate or, alternatively, the toned image can then be transferred to a second substrate. The transfer is performed by placing the transfer substrate over the image on the grounded substrate using spacers to create a gap, which is filled with the dispersing solvent used in the liquid toner. The corona is again passed over the sample to provide an electrostatic transfer charge. Under the influence of the transfer charge, the toner is transferred through the dispersant filled gap to the second substrate. The image on the second substrate is then thermally cured to convert the toner to pure metal and maintain the image integrity.

The liquid metallic toner comprises metal particles combined with a functionalized metallo-organic compound dispersed in a non-polar organic medium. When a charge director is added to the dispersion, a charge is imparted to the metal particles, and the particles can be electrostatically printed, transferred, and cured to give a high resolution, well-consolidated, well-bonded metallic conductor on various substrates.

DETAILED DESCRIPTION OF THE INVENTION

The three major components of PARMOD™ based liquid metallic toners are 1) metallic toner particles comprised of metal particles and metallo-organic decomposition (MOD) compound, 2) one or more charge director(s), and 3) a non-polar dispersing solvent. The MOD constituent of the toner particles is important because it interacts with the charge director(s) to impart a charge on the particles. The MOD, along with the charge director, can be used to vary the charge to mass ratio of the particles which is important to good electrostatic imaging. The MOD and the charge director also work in tandem to provide dispersability of the particles in the non-polar dispersing solvent. The MOD also allows for the PARMOD™ type consolidation of the metallic toner particles into a continuous metal film/conductor.

Metals which can be used as toner particles include copper, silver, gold, zinc, cadmium, palladium, iridium, ruthenium, osmium, rhodium, platinum, iron, cobalt, and nickel, (Groups lb, llb, and VIII), and indium, tin, antimony, lead, and bismuth The MOD of the toner particles can be formed as the particles are being formed in a metal precipitation reaction. The metal precipitation reaction is performed by dissolving or suspending a metal salt in the MOD compound it is to be combined with, and heating the solution or suspension to decompose the metal salt to form metal particles. As the metal particles form, they will reach a certain particle size at which point the solvent (organic medium) will react with the surface forming a MOD coating on the particles, thus stabilizing them at that particle size. It is believed that this process not only coats the metal particles but that some of the MOD compound is also incorporated amongst the metal particles. The restraint on this reaction is that the metal salt chosen for decomposition must have a lower decomposition temperature than the coating "salt" formed on the surface of the particle. This process is similar to the process disclosed in U.S. Pat. Nos. 4,186,244 & 4,463,030, both issued to Deffeyes. In one example the powder is made by thermally decomposing silver oxalate in a carboxylic acid (such as oleic acid). The resulting silver powder particles contain incorporated carboxylate and are effectively coated with the carboxylate.

When commercial metal particles are used, the MOD coating compound can be added to uncoated particles and adsorbed on the surface. This is accomplished by mixing the metal particle and the coating compound together in the dispersing medium. In the case of most metals, the coating compound will adsorb on the surface of the particles once mixed into the dispersing medium. This adsorption will give some amount of dispersability to the metal particles, depending on the coating compound used and its properties in the dispersing medium.

Preferred coating compounds are generally long chain carboxylic acids. The long organic chain provides dispersability in the dispersing solvent and the carboxylate functional group allows for strong adsorption on the metal particle surface. The functional group on the coating compound can be any ionizable group that would create an O, N, S, or P linkage with the metal particle surface. These types of linkages are important since the coating on the metal particles encompasses the PARMOD™ technology and enables the consolidation of the particles into a continuous film. The organic part of the compound can be a long chain, a branched chain, or contain cyclic groups, as long as it has solubility or micellular properties conducive to a non-polar organic solvent. The coatings on the metal particles that can be used include carboxylic acids, metal carboxylates, thiols, amines, alkoxides, and phosphines.

Commercially available metal powder or flake can also be used and coated with silver neodecanoate. As an example, this is done by adding silver powder or flake to silver neodecanoate just after it has been synthesized and is still an 'oil'. The silver neodecanoate then forms a coating on the silver powder or flake. This 'oily' powder or flake can then be 'dried' (as the silver neodecanoate would be) by washing with methanol to give a dry powder.

The MOD coatings also function as a Charge Control Agent within the liquid toners. The charge control agents in the toners are preferably the MOD coatings on the metal particles. In general, a charge control agent must either be insoluble in the carrier solvent or be bound to the toner particle. It must be structurally capable of interacting with the charge director to generate the charge on the toner particle. Some examples of charge control agents are aluminum salts of organic acids, quaternary ammonium salts, and low molecular weight organic acids. Preferred charge control agents are carboxylic acids such as neodecanoic acid, neoheptanoic acid, neopentanoic acid, 2-ethylhexanoic acid, oleic acid, and silver neodecanoate.

The main function of the charge director is to provide the charge on the toner particles. As such, it also acts as a dispersing agent. The general properties of a charge director include its solubility in the carrier liquid, its ability to structurally interact with the charge control agent to provide the charge on the toner particle, and it should not be "very" hygroscopic. In general this means a molecule that contains an ionizable functional group as well as an organic portion which is soluble in the carrier solvent. In relation to the 'structural interaction with the charge control agent', the charge director's functional group should be able to interact ionically with the charge control agent, without being sterically inhibited by the organic portion.

The charge directors are thought to impart charge to the particles by forming inverse-micelles in the non-polar dispersing solvent. These inverse micelles then solubilize the ionic functional group of the organic coating compound, allowing ionization and the creation of a charge at the surface of the metal particle by proton transfer for example. By using a charge director separate from the coating on the particle, it is possible to vary the amount of charge widely, without having an effect on the PARMOD™ chemistry involved in curing the metal particles to a continuous film. A charge director will create a different amount of charge on the same particles depending on the micellular properties of the charge director in the dispersing solvent. Therefore, different charge directors present in the same concentration will provide different amounts of charge. By varying the concentration of the charge director, the solution conductivity can be varied and the charge to mass ratio for the particles can be controlled. This is very important because the amount of charge on the particles and the amount of excess conductivity in the solution strongly affect the quality of the developed latent image and the ability to transfer a good quality image to another substrate. Enough of the charge director is used to obtain a preferred solution conductivity of between about 3 and about 100 pS/cm)

Surface active agents (surfactants) that have the properties described above can be used as charge directors. Examples of compounds which can be used as charge directors include alkali metal soaps, divalent and trivalent metal carboxylates (e.g., zirconium 2-ethylhexanoate, copper napthenate, or aluminum stearate), block copolymers, fatty amines (e.g., Troysol 98C), zwitterionic compounds (e.g., Lecithin), and sulphonated petroleum hydrocarbons also known as metal petronates (e.g., Basic Barium Petronate or Calcium Petronate), polymeric esters, phosphated diglycerides, sulfonates, functionalized diblock copolymers, and other ionic surfactant molecules.

Preferred charge directors include zirconium 2-ethylhexanoate, Troysol 98C, Lecithin, Basic Barium Petronate, and the Indigo Imaging agent, which is an NVP copolymer with lecithin and basic barium petronate integrated in the polymer and mixtures thereof. Preferred mixtures comprises lecithin and basic barium petronate in various ratios.

The dispersing solvent is a non-polar organic liquid with a vapor pressure such that it will evaporate relatively easily from the printed image, but not from the bulk liquid toner solution. The non-polar organic properties are necessary so that the solvent does not discharge the latent image as the toner particles develop it. The dispersing solvent acts as a carrier for the toner particles to get them to the latent image, but does not play a role in the PARMOD™ chemistry to form the continuous metal film. As with conventional liquid toners, once the desired image is formed, the dispersing solvent is removed by evaporation. Acceptable dispersing solvents include isoparaffinic hydrocarbons, halogenated or partially halogenated fluids and silicones. Some commercially available hydrocarbons include Isopar®, Norpar®, Shell-Sol®, and Soltrol®. The Isopar® series of isoparaffin solvents from Exxon Chemical are preferred as dispersing solvents, but other solvents with a resistivity greater than $10^{11}$ Ω-cm, a dielectric constant less than 3.5 and a boiling point in the range of 150–220° C., can also be used. The Kauri-butanol number (solvency) should be less than 30.

The photopolymer material, such as a dry film or liquid resist, typically is formed of polymers which become cross-linked to form the imaged areas having greater electrical resistivity that can be an order of magnitude or greater more dielectric than the background or unexposed areas. The desired electrostatic latent image pattern remains in the photopolymer material by using the material's ability to retain differences in resistivity for relatively long periods of time after having been exposed to actinic radiation to form cross-linked areas of increased resistivity and areas unexposed to the actinic radiation which remain the less resistive areas. Suitable dry film photoresists include those sold under the tradenames Riston 1215 and Riston 3615 by DuPont and BASF's 38 micron thick film supplied under the designation WN-0038. A liquid photopolymer could also be applied with a solvent to the conductive substrate and dried.

A substrate is coated with a photopolymer material on at least one side. Exposure to actinic radiation causes cross-linking of the polymers in the material. The cross-linked photopolymer material exhibits a change in resistivity. A permanent latent image can formed on the photopolymer material by actinicly radiating the photopolymer through a mask or phototool or by drawing the desired pattern on the photopolymer with a laser. Both methods cross-link the irradiated photopolymer resulting in differences in the resistivity between imaged and non-imaged areas on the photopolymer material. The imaged photopolymer surface is then charged with a corona charging device to produce a pattern of charge retention that corresponds to the pattern of cross-linked photopolymer.

The charged photopolymer surface is then developed by the application of liquid metallic toner particles that are charged oppositely to the charge on the photopolymer surface. It may be necessary to wait a sufficient length of time after charging for the electric charge field to dissipate from above the unexposed/uncross-linked areas of the photopolymer material before applying the toner particles. The charged liquid metallic toner particles are drawn to the charged areas of the photopolymer surface to form or develop the latent image.

The developed image thus is ready for 1) thermal curing to produce solid metal components or 2) transfer to an electrically isolated conductive receiving surface or a non-conductive receiving surface, such as by a xeroprinting process where a master with the permanent image which is mounted to a grounded conductive backing, is charged, developed by the application of toner particles and the developed image is electrostatically transferred to another receiving surface to produce a circuit board with the desired conductive wiring pattern. This transfer method is more filly explained in, e.g., U.S. Pat. No. 3,004,860 issued to Gundlach, herein specifically incorporated by reference in pertinent part.

In a preferred embodiment, the photopolymer is developed on the end-product substrate, the liquid metallic toner is applied to the latent, charged image on the developed portion of the photopolymer and the substrate with photopolymer and toner is then heat treated to cure the PAR-MOD™ toner particles and further cure the photopolymer.

In another embodiment the charged image is created using ionography, in which the charged image is created by digitally controlled discharge from a row of electrodes. The image is toned with the liquid metallic toners and then transferred and cured or, cured in place, as previously described.

The examples described below indicate how the individual constituents of the preferred compositions and the conditions for applying them function to provide the desired result. The examples will serve to further typify the nature of this invention, but should not be construed as a limitation in the scope thereof, which scope is defined solely in the appended claims.

EXAMPLE 1

Preparation of Coated Particles
A. Oleate coated silver nanopowder

An oleate coated silver powder was synthesized as follows: Silver oxalate (doped with 1% copper for heat stabilization) (20 g) is slurried into oleic acid (250 mL) by stirring with a magnetic stir bar. The solution is then heated on a hot plate with stirring to 185° C. for 90 minutes. The solution is then allowed to cool to room temperature and the dark gray precipitate settles to the bottom. The solvent is then carefully removed by pipette from the top of the precipitate. Then to remove the remaining solvent the precipitate is washed with 3×50 mL tetrahydrofuran (THF) by stirring the precipitate with the THF then allowing it to settle and then removing the THF by pipette from the top of the precipitate. The precipitate is then washed 3×50 ml with Isopar H in the same manner. Finally, the wet precipitate is dispersed in Isopar H (80 g) and treated ultrasonically for 30 minutes. This method gives a dispersion of silver particles with approximately 10% Ag (wt/wt).

B. Degussa silver flake coated with carboxylic acid(s)

Degussa silver flake (2 g) was stirred together with oleic acid (0.1 g) in Isopar H (100 mL). The dispersion was ultrasonicated for 30 minutes. The oleic acid can be replaced with neodecanoic acid, noeheptanoic acid, neopentanoic acid, or 2-ethylhexanoic acid.

EXAMPLE 2

Dispersion and Charging of the Coated Particles
A. Oleate coated silver nanopowder toner.

The coated silver nanopowder from Example 1A (2 g) was ultrasonically dispersed in Isopar H (100 mL) for 30 minutes. To this dispersion was added enough Indigo Imaging Agent (IIA) to give a solution conductivity (as measured with a Scientifica 627 Conductivity Meter) of 2.7 pmho/cm.
B. Oleate coated silver nanopowder toner.

The coated silver nanopowder from Example 1A (2 g) was ultrasonically dispersed in Isopar H (100 mL) for 30 minutes. To this dispersion was added enough Troy Sol 98c (fatty amine) to give a solution conductivity of 0.7 pmho/cm.
C. Degussa silver flake toner.

Degussa silver flake (2 g) coated with oleic acid was ultrasonically dispersed in Isopar H (100 mL) for 30 minutes. To this dispersion was added enough Troy Sol 98c to give a solution conductivity of 0.7 pmho/cm.
D. Degussa silver flake toner.

Degussa silver flake (2 g) coated with neodecanoic acid was ultrasonically dispersed in Isopar H (100 mL) for 30 minutes. To this dispersion was added enough IIA to give a solution conductivity of 7.0 pmho/cm.

EXAMPLE 3

Developing and Converting Electrostatic Images to Pure Silver
A. Photopolymer substrate A grounded, photoimaged printing plate with a liquid photo resistant surface was electrostatically charged by passing a 5000 V corona over it. Liquid toner from Example 2A was then applied to the printing plate to develop the latent electrostatic image. The image was then washed with Isopar H to remove excess toner. The image was then allowed to dry at room temperature (5 minutes). The developed image was then heated to 220° C. for 3 minutes to give a continuous, pure silver film. The electrical resistivity of the silver film was 5.7 $\mu\Omega$-cm compared with 1.59 $\mu\Omega$-cm for bulk silver. The silver film had good adhesion to the substrate. The adhesion of the silver to the substrate was determined by a Scotch tape test where the tape was applied to the conductor and peeled off. This exerts a peel force on the conductor of approximately 6 lb/in (1050 N/m).
B. Dry film solder mask substrate The same printing process as Example 3A was used except that the printing plate had dry film solder mask on the surface. The developed and dried silver toner image was then heated to 260° C. for 3 minutes to give a continuous, pure silver film. The electrical resistivity of the silver film was 5.0 $\mu\Omega$-cm with good adhesion to the substrate.

EXAMPLE 4

Transferred and Cured Printed Images
A. Corning 7059 low alkali glass substrate

Printing of an electrostatic image was done as in Example 3A and the developed image was washed with Isopar H. Rather than drying the image, the image was then transferred across a 1 mil, Isopar H filled gap, to a Corning 7059 low alkali glass substrate. The transfer was done by creating a 1 mil gap with spacers on the surface of the printed image. The gap was filled with Isopar H and the glass substrate was placed on the spacers. A corona with a voltage of 1250 V was then passed over the substrate. The electrostatic charge of the corona caused the toner particles on the developed image to move across the 1 mil gap and deposit on the glass substrate. The glass was then carefully removed and allowed to dry at room temperature. The transferred image was then heated to 400° C. for 5 minutes to give a continuous, pure silver film. The electrical resistivity of sample was 1.7 $\mu\Omega$-cm with good adhesion to the substrate. High resolution images with 40 $\mu$m wide lines and 80 $\mu$m wide spaces could be obtained.

B. Kapton®H flexible substrate

With a flexible substrate, the gap transfer method was varied. The DuPont Kapton®H flexible substrate was taped to a conductive aluminum, 4 inch diameter roller. The 1 mil gap was created with spacers and filled with Isopar H as in Example 4A. The roller with the Kapton ®H substrate was then placed on the spacers and a transfer voltage of 1250 V was applied to the roller. The substrate was then rolled across the image. The developed image was transferred to the Kapton®H substrate. The substrate was then allowed to dry at room temperature (5 minutes) and removed from the roller. The image was heated to 350° C. for 3 minutes to give a continuous, pure silver film. The electrical resistivity of the silver film was 4.5 $\mu\Omega$-cm with good adhesion to the substrate.

What is claimed:

1. A composition of matter comprising metallic toner particles which are comprised of metal particles combined with a reactive organic compound; one or more charge director(s), and a non-polar dispersing solvent, wherein said composition can be electrostatically applied to a substrate and heated in an oven to consolidate the composition to a solid pure metal conductor at a temperature below about 450° C.

2. The composition of claim 1 wherein said metallic toner particles can maintain an applied electrical charge.

3. The composition of claim 1 wherein said reactive-organic compound is a reactive organic medium comprised of one or more reactive organic compounds each having a different decomposition temperature, wherein the reactive organic medium has a decomposition temperature which is different from each of said reactive organic compounds.

4. The composition of claim 1 in which said metal particles are selected from the group consisting of copper, silver, gold, zinc, cadmium, palladium, iridium, ruthenium, osmium, rhodium, platinum, iron, cobalt, nickel, (Groups Ib, IIb, and VIII), indium, tin, antimony, lead, and bismuth.

5. The composition of claim 4 in which the metallic toner particles are formed in a metal precipitation reaction.

6. The composition of claim 4 in which the metallic toner particles are formed by mixing said metal particles and said reactive-organic compound together in said dispersing solvent, said reactive-organic compound being selected from the group consisting of carboxylic acids, metal carboxylates, thiols, amines, alkoxides, and phosphines.

7. The composition of claim 6 in which the reactive-organic compound comprises long chain carboxylic acids.

8. The composition of claim 4 in which the metal particles are silver and the reactive-organic compound is silver neo-decanoate.

9. The composition of claim 1 in which said charge director is selected from the group consisting of alkali metal soaps, divalent and trivalent metal carboxylates, zirconium 2-ethylhexanoate, copper napthenate, aluminum stearate, block copolymers, fatty amines, zwitterionic compounds, sulphonated petroleum hydrocarbons, polymeric esters, phosphated diglycerides, sulfonates, functionalized diblock copolymers, other ionic surfactant molecules, and mixtures thereof.

10. The composition of claim 1 in which the conductivity of the composition is between about 3 and about 100 pS/cm.

11. The composition of claim 1 in which the dispersing solvent is a non-polar organic liquid.

12. The composition of claim 1 in which the dispersing solvent is selected from the group consisting of isoparaffinic hydrocarbons, halogenated or partially halogenated fluids and silicones.

13. The composition of claim 1 in which the dispersing solvent has a resistivity greater than $10^{11}$ $\Omega$-cm, a dielectric constant less than 3.5, a boiling point in the range of 150–220° C., and a Kauri-butanol number (solvency) less than 30.

14. The composition of claim 1 in which the dispersing solvent is selected from the group consisting of Isopar, Norpar, Shell-Sol, and Soltrol.

15. The composition of claim 14 in which the dispersing solvent is Isopar.

16. A electrostatic process for producing electronic components on a substrate which comprises the steps of:

1) coating the substrate with a photopolymer having a photopolymerizable resistivity;

2) exposing said photopolymer to imagewise actinic radiation, thereby cross-linking said exposed areas of said photopolymer;

3) without removing unexposed photopolymer areas, charging the exposed areas of photopolymer by corona discharge;

4) developing the image by flooding the exposed and unexposed areas of the photopolymer with a liquid metallic toner having oppositely charged metallic toner particles;

5) transferring the toner image to a second substrate; and 6) thermally curing said liquid metallic toner image into a solid metal.

17. The process of claim 16 in which said transferring step 5) is skipped and said toner image is thermally cured, step 6) on the substrate.

18. The process of claim 16 wherein said liquid metallic toner is comprised of metallic toner particles which are comprised of metal particles combined with a reactive organic compound; one or more charge director(s), and a non-polar dispersing solvent, wherein said composition can be electrostatically applied to a substrate and heated in an oven to consolidate the composition to a solid pure metal conductor at a temperature below about 450° C.

* * * * *